United States Patent [19]

Kihara et al.

[11] Patent Number: 5,286,986
[45] Date of Patent: Feb. 15, 1994

[54] SEMICONDUCTOR DEVICE HAVING CCD AND ITS PERIPHERAL BIPOLAR TRANSISTORS

[75] Inventors: Kazuo Kihara, Yokohama; Minoru Taguchi, Oomiya, both of Japan

[73] Assignee: Kabushiki Kaisha Toshiba, Tokyo, Japan

[21] Appl. No.: 837,091

[22] Filed: Feb. 18, 1992

Related U.S. Application Data

[63] Continuation of Ser. No. 505,995, Apr. 9, 1990, abandoned.

[30] Foreign Application Priority Data

Apr. 13, 1989 [JP] Japan ................................. 1-93607

[51] Int. Cl.⁵ ..................... H01L 29/78; H01L 27/02; H01L 29/72
[52] U.S. Cl. ..................... 257/215; 257/370; 257/372; 257/373; 257/378; 257/400; 257/552; 257/557; 257/565
[58] Field of Search ............... 357/24, 43, 35, 34; 257/215, 216, 236, 370, 372, 373, 378, 400, 552, 557, 565

[56] References Cited

U.S. PATENT DOCUMENTS

| | | | |
|---|---|---|---|
| 4,034,199 | 7/1977 | Lampe et al. | 253/193 |
| 4,152,715 | 5/1979 | Wang | 357/35 |
| 4,163,245 | 7/1979 | Kinoshita | 357/51 |
| 4,253,168 | 2/1981 | Petrosky et al. | 357/24 |
| 4,255,677 | 3/1981 | Boonstra et al. | 357/24 |
| 4,314,857 | 2/1982 | Aitken | 357/24 |
| 4,672,645 | 6/1987 | Bluzer et al. | 357/24 |
| 4,746,963 | 5/1988 | Uchida et al. | 357/50 |
| 4,799,098 | 1/1989 | Ikeda et al. | 357/48 |
| 4,825,275 | 4/1989 | Tomassetti | 357/43 |
| 4,859,624 | 8/1989 | Goto | 437/53 |
| 4,862,240 | 8/1989 | Watanabe et al. | 357/42 |
| 4,898,836 | 2/1990 | Zambrano et al. | 437/31 |
| 4,912,054 | 3/1990 | Tomassetti | 357/43 |
| 4,922,318 | 5/1990 | Thomas et al. | 357/43 |
| 4,994,888 | 2/1991 | Taguchi et al. | 357/24 |

FOREIGN PATENT DOCUMENTS

| | | |
|---|---|---|
| 0067661 | 12/1982 | European Pat. Off. ............. 357/43 |
| 2655400 | 12/1976 | Fed. Rep. of Germany . |
| 2808558 | 2/1978 | Fed. Rep. of Germany . |
| 57-135499 | 8/1982 | Japan . |
| 60-132367 | 7/1985 | Japan . |
| 63-161 | 1/1988 | Japan . |

Primary Examiner—Ngan Ngo
Attorney, Agent, or Firm—Banner, Birch, McKie & Beckett

[57] ABSTRACT

In a semiconductor device, a charge transfer device, a bipolar transistor, and a MOSFET are formed on a single chip, and the peripheral portion of the charge transfer device is surrounded by an N⁺-type region. Since the charge transfer device block is surrounded by the N⁺-type region and the N⁺-type buried layer, leaked charge of clocks from the charge transfer device is absorbed by the N⁺-type region and the N⁺-type buried layer.

5 Claims, 13 Drawing Sheets

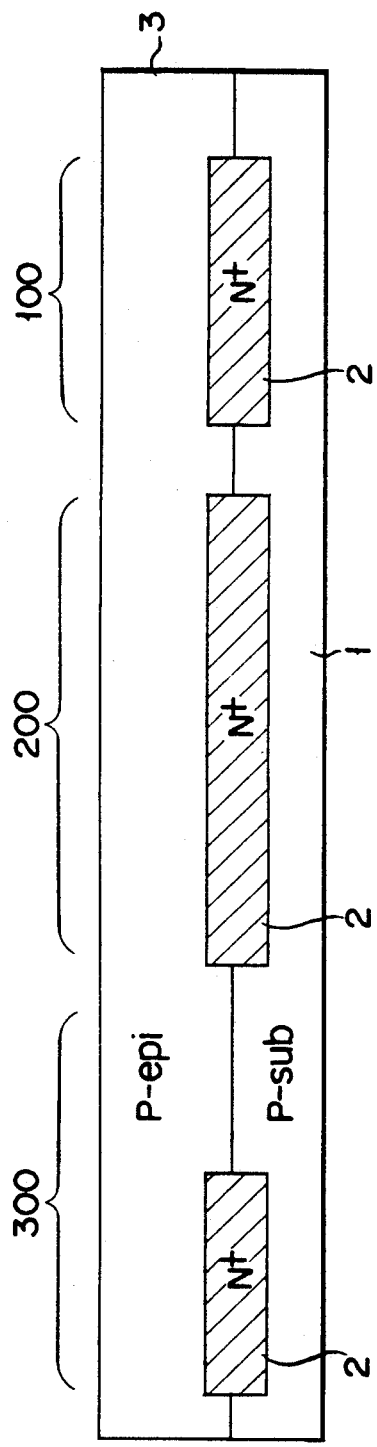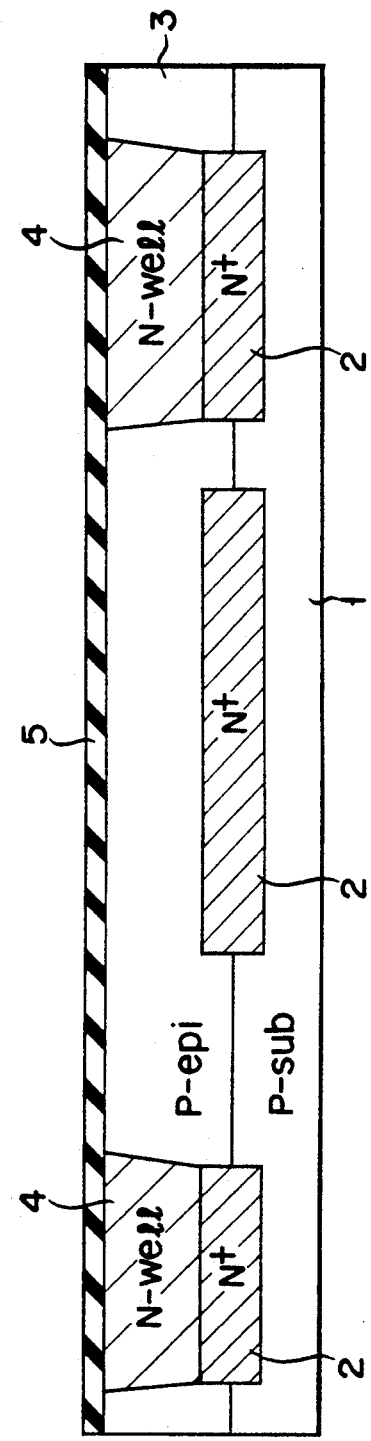

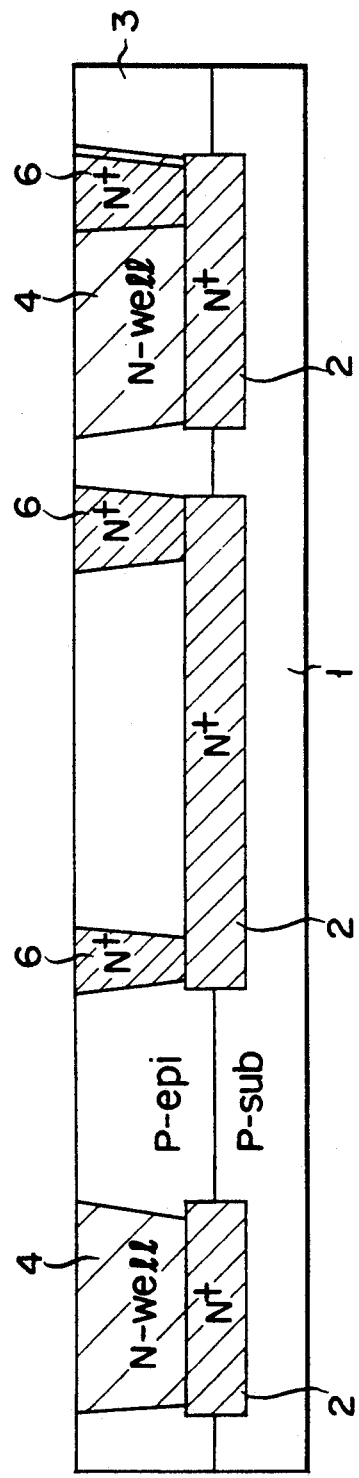
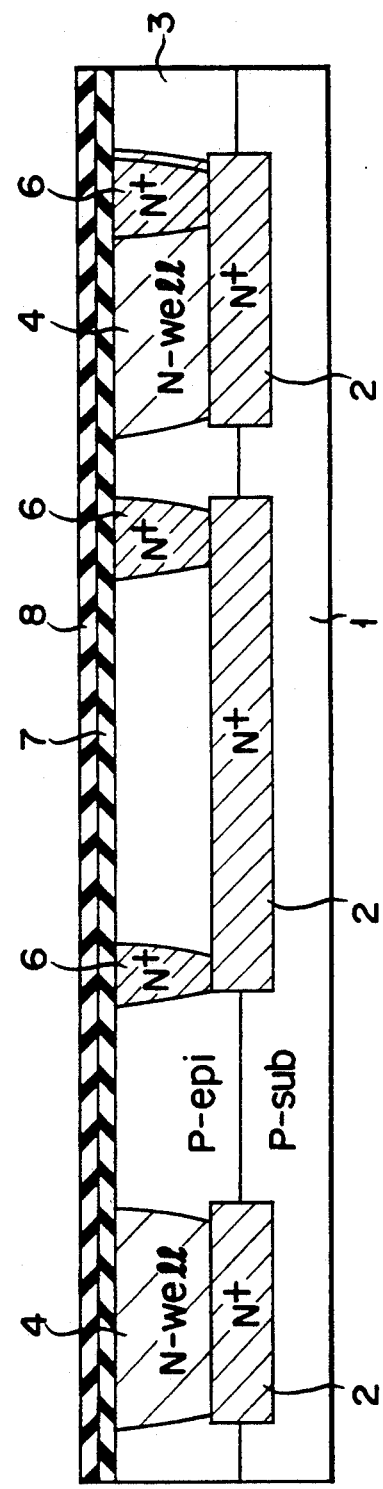
FIG. 1C
FIG. 1D

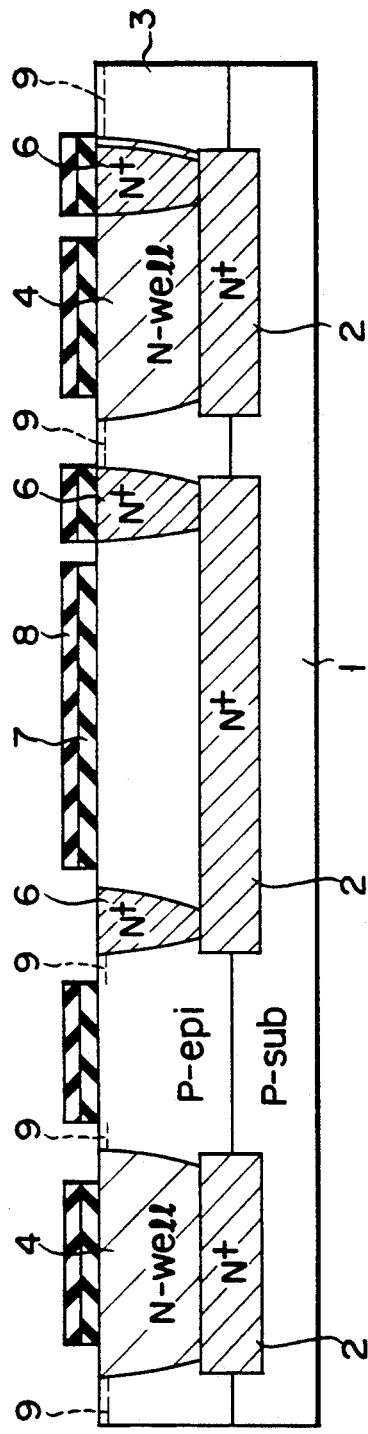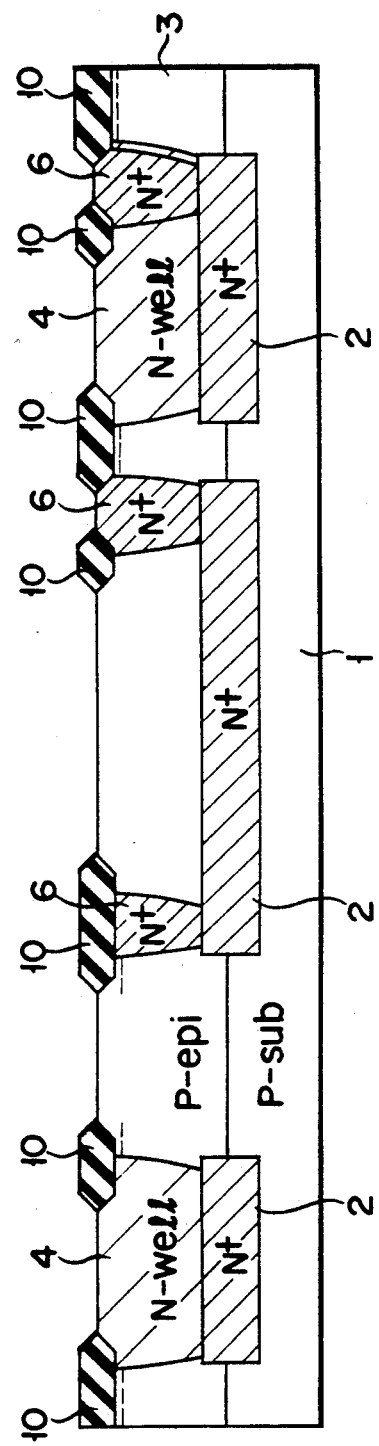

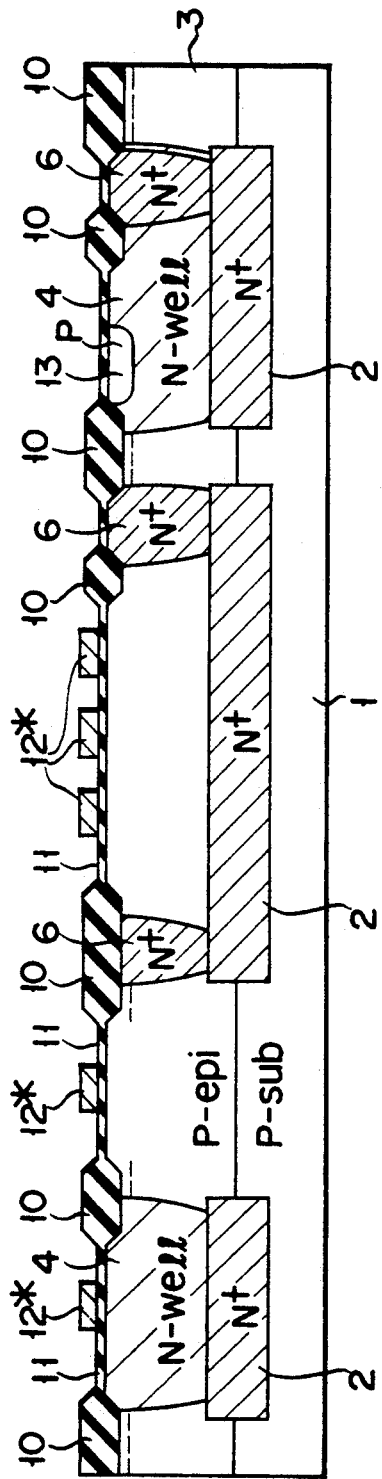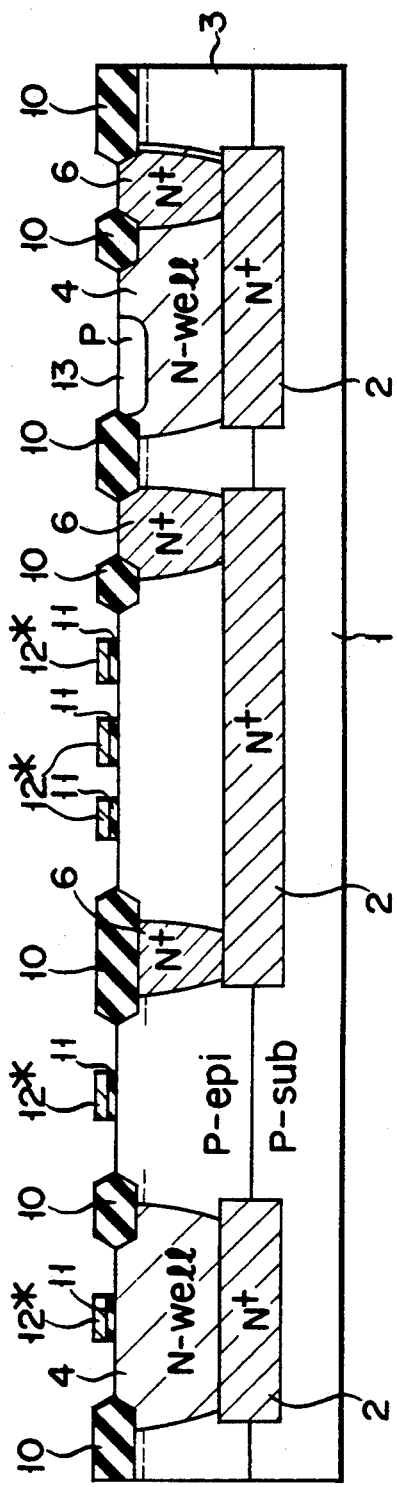
FIG. 1I
FIG. 1J

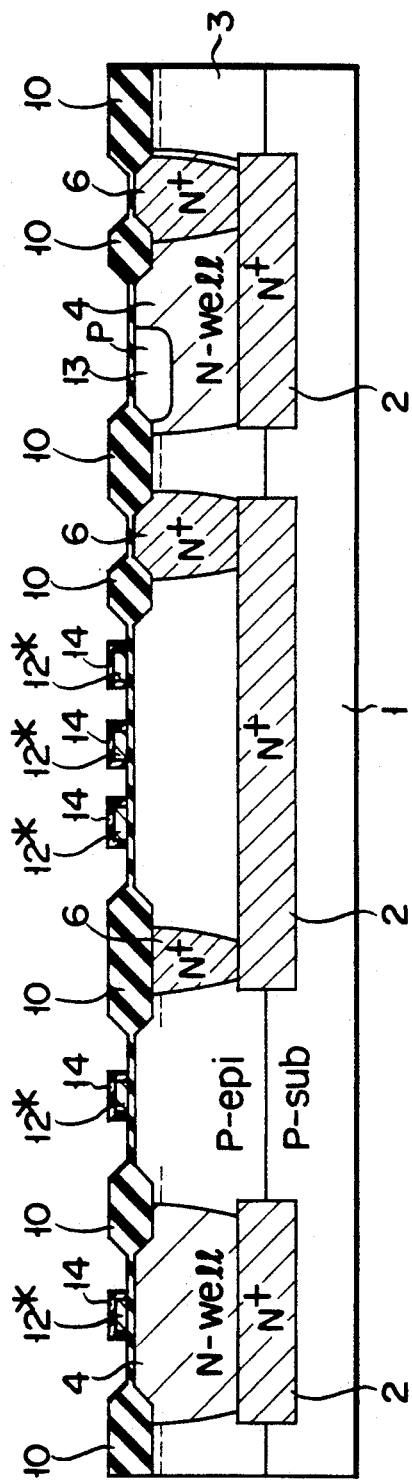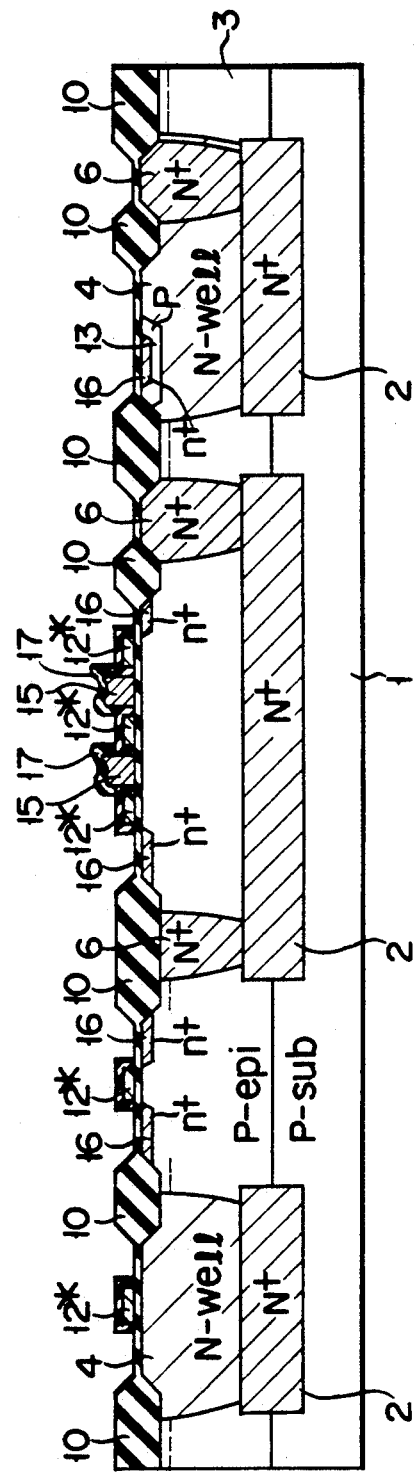

SEMICONDUCTOR DEVICE HAVING CCD AND ITS PERIPHERAL BIPOLAR TRANSISTORS

This application is a continuation of application Ser. No. 07/505,995, filed Apr. 9, 1990, now abandoned.

BACKGROUND OF THE INVENTION

1. Field of the Invention

The present invention relates to a semiconductor device having a charge transfer device in which a bipolar transistor and a MOSFET are formed on a single chip.

2. Description of the Related Art

In general, a CCD, which is one type of charge transfer device, is formed on a single chip in combination with n-channel type MOSFETs. The n-channel type MOSFETs, combined with the CCD, constitute a CCD delay line, a CCD drive circuit, a sample/hold circuit, an output circuit, a clock drive circuit, etc. The power source voltage employed in the MOSFET is 12 V or 9 V. Recently, in accordance with a requirement for the reduction in power consumption, a power source voltage of 5 V is employed in order to use MOSFETs in the form of CMOS's, and to match the power source voltage for the FET with that for a bipolar IC formed in another chip.

However, in the case where the power source voltage of 5 V is employed, as compared to the conventionally employed power source voltage of 12 V or 9 V, the input/output linearity of a sample/hold circuit and an operational amplifier such as an output circuit, which are constituted by MOSFETs, is degraded. Thus, the yield of wafers is lowered owing to poor linearity of input/output characteristics in a wafer test.

Also, the only function of a CCD delay line using a CCD is to delay an input signal. The circuit for performing delay processing for this signal is, in general, a bipolar IC formed on a separate chip.

For example, when MOSFETs used in a sample/hold circuit and/or an operational amplifier such as an output circuit are replaced with bipolar transistors which have excellent input/output linearity and operate at high speed at low voltage, and if these bipolar transistors and CCDs are formed on a single chip, the input/output linearity can be improved, the yield is enhanced, and high-performance is achieved. Further, if bipolar transistors for processing signals from CCDs and CCDs are formed on a single chip, such advantages as reduction in size and manufacturing cost, increase in the number of functions, and simplification in system can be brought about.

However, if CCDs are used along with bipolar transistors on a single chip, charge of transfer clocks employed for transferring charge of CCDs may leak to a base region or the like in a bipolar transistor. Because of this, it is difficult to use CCDs along with bipolar transistors on a single chip. In other words, the circuit operation of the bipolar transistor is considerably adversely affected by the leak of transfer clocks, the characteristics of the bipolar transistor are degraded, and the reliability of the product is lowered.

SUMMARY OF THE INVENTION

The present invention has been made in consideration of the above circumstances, and a first object of the present invention is to form a charge transfer device and a bipolar transistor on a single chip, without lowering the reliability of a finished device.

A second object of the invention is to constitute a linear amplifier by bipolar transistors, the linear amplifier being provided in a semiconductor device including a charge transfer device. Thus, the input/output linearity of the linear amplifier is enhanced, the yield of semiconductor devices including charge transfer devices is increased, and the high-performance of the device is achieved.

A third object of the invention is to include a bipolar IC (including a logic circuit or a non-linear amplifier) for processing signals for a charge transfer device on the same chip as other elements, thereby enlarging the function of the semiconductor device including the charge transfer device, and simplifying the structure of the hardware of the system.

The present invention provides a semiconductor device including a charge transfer device, and a method of manufacturing the same, which have the aforementioned features.

According to the semiconductor device including a charge transfer device of the present invention, a charge transfer device and a bipolar transistor are formed on a single chip, and the periphery of the charge transfer device is surrounded by an N-type region.

Also, the manufacturing method of the present invention comprises the steps of: forming an N+-type buried layer in each of a charge transfer device formation region, an NPN-type bipolar transistor formation region, and a P-channel type MOSFET formation region on a P-type semiconductor substrate; forming a P-type epitaxial layer on the P-type semiconductor substrate in which the N+-type buried layers have been formed; forming at least two N-type well regions in the P-type epitaxial layer, such that the N-type well regions reach the N+-type buried layers formed in the NPN-type bipolar transistor formation region and the P-channel type MOSFET formation region; forming N+-type regions in the N-type well region formed in the NPN-type bipolar transistor formation region, and in the P-type epitaxial layer in a peripheral region of the charge transfer device formation region, such that the N-type regions reach the N-type buried layers; and forming an NPN-type bipolar transistor block and a P-channel type MOSFET block in said N-type well regions, forming an N-channel type MOSFET block in the P-type epitaxial layer, and forming a charge transfer device block in a region in the P-type epitaxial layer surrounded by said N+-type region.

In the above-described semiconductor device, since the charge transfer device block is surrounded by the N+-type region and the N+-type buried layer, leaked charge of clocks from the charge transfer device is absorbed by the N+-type region and the N+-type buried layer. Thus, even if the charge transfer device and the bipolar transistor are formed on a single chip, the bipolar transistor is not adversely affected by the clock leak. Even if a sample/hold circuit and an operational amplifier such as an output circuit, provided in the semiconductor device including the charge transfer device, are constituted by bipolar transistors, whereby the power source voltage is lowered, for example, to 5 V, the excellent input/output linearity is maintained. In addition, it is possible to integrate a bipolar IC for processing signals for the charge transfer device in the same chip, and therefore it is possible to reduce the manufacturing cost of the semiconductor device including the charge transfer device, increase the integration density, increase the number of functions of the device, and simplify the structure of the whole system.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1N are cross-sectional views for illustrating the process of manufacturing a semiconductor device according to an embodiment of the present invention, in which FIG. 1A shows the state wherein three N+-type buried layers are formed in a P-type substrate, and a P-type epitaxial layer is formed over the three N+-type buried layers;

FIG. 1B shows the state wherein N-type wells are formed on the two N+-type buried layers (on the right and left in the figure), and a silicon oxide film is formed on the resultant structure;

FIG. 1C shows the state wherein an N+-type wall is formed on a peripheral region of the middle N+-type buried layer;

FIG. 1D shows the state wherein a double layer consisting of an oxide layer and a nitride layer is formed on the device;

FIG. 1E shows the state wherein a P-inversion preventing layer is formed around the walls of the right and left N-type wells and the middle N+-type well;

FIG. 1F shows the state wherein field oxide films are formed on the peripheral portions of the right and left N-type wells and on the wall of the middle N+-type well;

FIG. 1I shows the state wherein the polysilicon layer is patterned and thereby gate electrodes are formed, and also a P-type base region is formed in the N-type well;

FIG. 1J shows the state wherein the oxide film is removed, excepting for predetermined regions;

FIG. 1K shows the state wherein a second gate electrode film is formed;

FIG. 1L shows the state wherein a second polysilicon layer is formed, and an N+-type emitter region is formed on the P-type base region in the right N-type well;

FIG. 1N is a cross-sectional view of a semiconductor device which has been finished by providing the structure shown in FIG. 1M with predetermined contacts;

DETAILED DESCRIPTION OF THE PREFERRED EMBODIMENTS

A semiconductor device having a charge transfer device and a method of manufacturing the same, according to an embodiment of the present invention, will now be described with reference to the accompanying drawings.

Figure 1G:
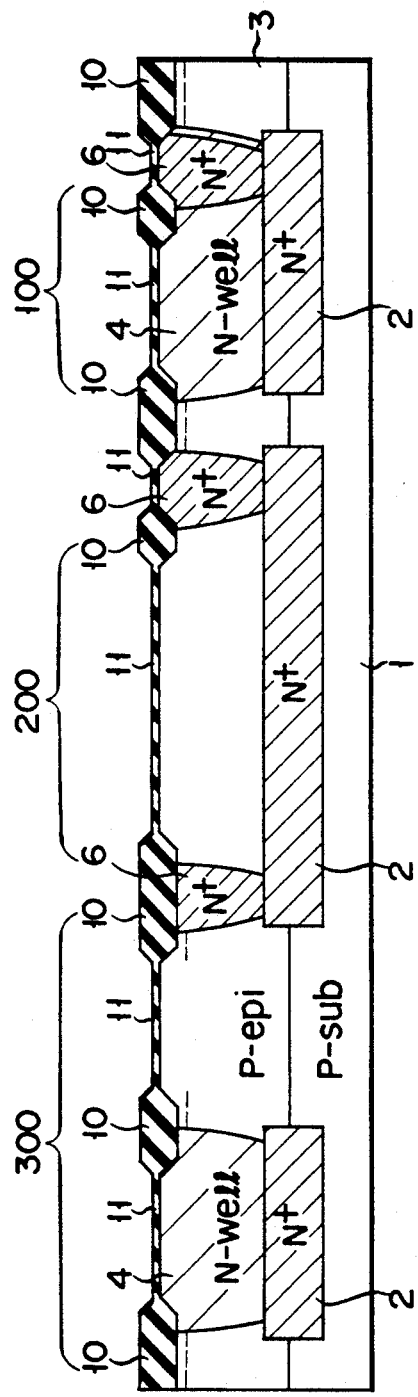
FIG. 1G shows the state wherein gate oxide films are formed between the individual field oxide films.
Figure 1H:
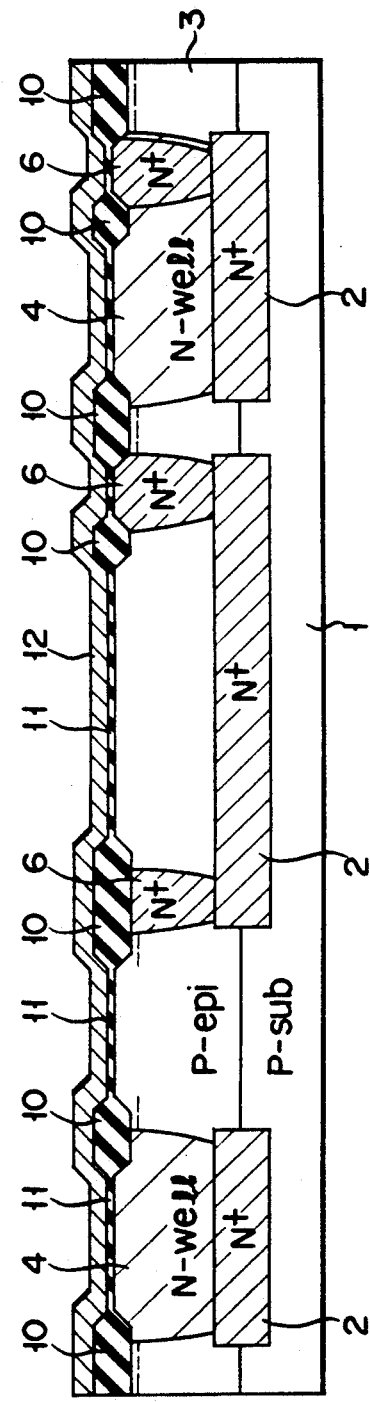
FIG. 1H shows the state wherein a polysilicon layer are formed on the field oxide films and the gate oxide films.
Figure 1M:
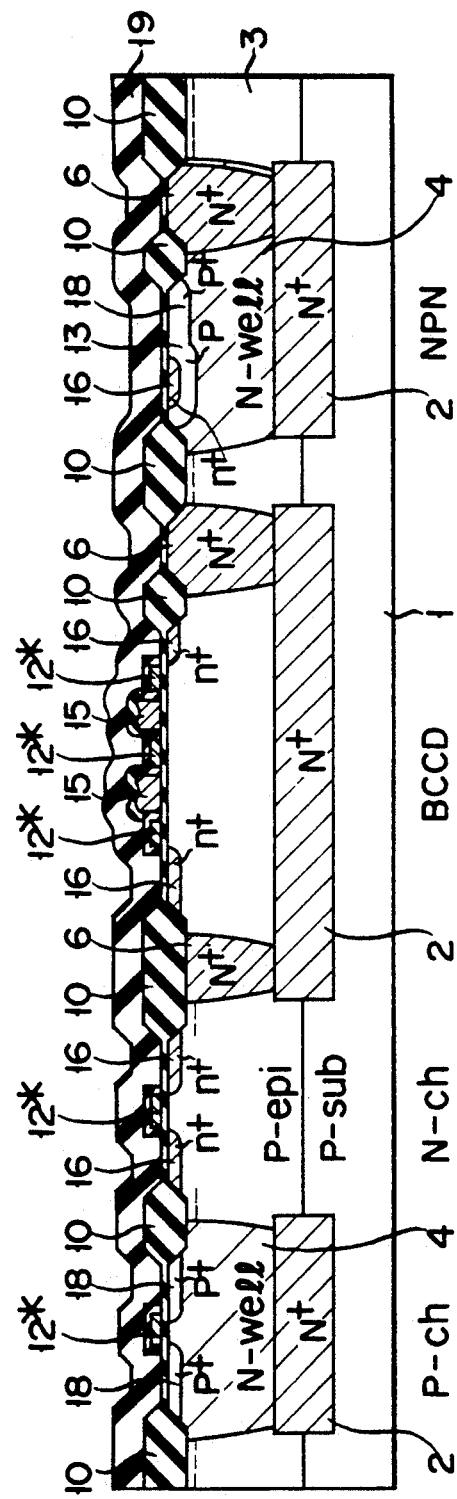
FIG. 1M shows the state wherein a PMOS transistor is formed in the left N-type well region, and an insulating film is formed on the uppermost layer of the chip.
Figure 1N:
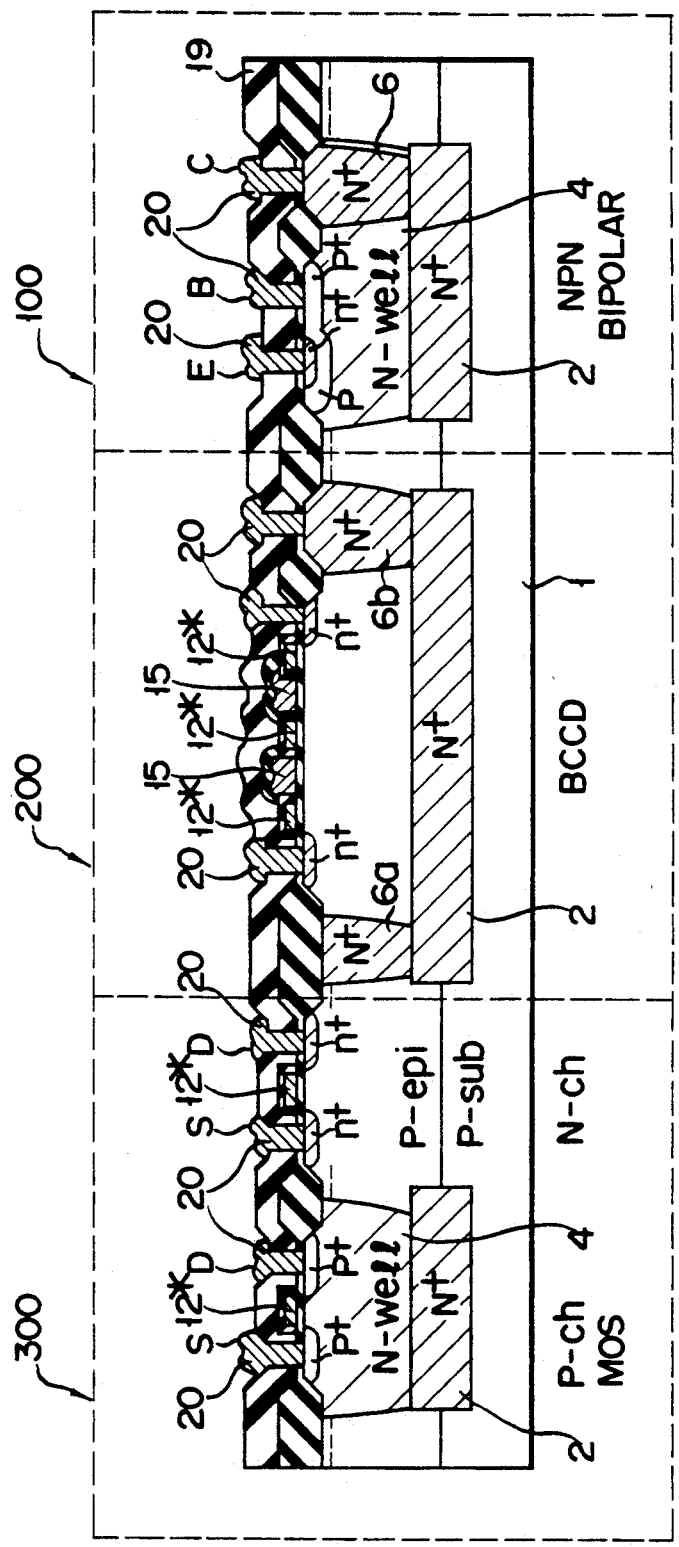

FIGS. 1A to 1N are cross-sectional views for illustrating the method of manufacturing a semiconductor device with a charge transfer device, according to an embodiment of the present invention, in the order of the manufacturing steps.

In FIG. 1A, an oxide film (not shown) is formed on a P-type semiconductor substrate 1, before an epitaxial layer 3 is formed. The oxide film is patterned by means of photoetching using a photoresist, thereby to form a pattern for high-concentration N+-type buried layers. With this pattern used as a mask, an N-type impurity or arsenic is ion-implanted, thus forming high-concentration N+-type buried layers 2 in a bipolar transistor formation region 100, a CCD formation region 200, and a MOS transistor formation region 300. Then, a P-type epitaxial layer 3 is formed over the surface of the substrate by means of a CVD method. The impurity concentration of the P-type epitaxial layer 3 is set to an optimal value for the characteristics of a CCD to be manufactured.

As shown in FIG. 1B, the P-type epitaxial layer 3 is subjected to a heat treatment in an oxygen atmosphere at a temperature of 950° C. by means of a thermal oxidizing method, whereby an oxide layer 5 having a thickness of 500 Å is formed. Subsequently, a photoresist (not shown) is coated, and a pattern for an N-type well region is formed on the photoresist by means of photoetching. With the photoresist having the pattern being used, an N-type impurity such as phosphorus is ion-implanted under the conditions of an acceleration voltage of 100 KeV and a dose amount of $2.0 \times 10^{12}$ cm$^{-2}$. The ion-implanted phosphorus is subjected to a heat treatment in a nitrogen atmosphere at a temperature of 1100° C. for 5 hours, thus forming an N-type well region 4 such that the region 4 reaches the high-concentration N+-type buried layer 2.

A photoresist (not shown) is coated on the epitaxial layer 3, and a mask pattern is formed on the photoresist by means of photoetching. This mask pattern is used to form a collector take-out region of a npn-type bipolar transistor, and a high-concentration N+-type region situated around a BCCD (Bulk CCD, serving as a charge transfer device) formation region. With the photoresist having the pattern being used, an n-type impurity such as phosphorus is ion-implanted under the conditions of an acceleration voltage of 50 KeV and a dose amount of $5.0\times10^{15}$ cm$^{-2}$. Then, a CVD oxide film (serving as a cap for preventing out-diffusion) is formed by means of a CVD method, such that the CVD oxide film has a thickness of 4,000 Å. The ion-implanted phosphorus is subjected to a heat treatment in a nitrogen atmosphere at a temperature of 1100° C. and for 30 minutes. Thereafter, the surface oxide film is removed. As shown in FIG. 1C, a high-concentration N+-region 6 is formed such that it reaches the high-concentration N+-type buried layer 2.

The epitaxial layer 3 is subjected to a thermal oxidizing process in an atmosphere of a mixture of hydrogen and oxygen at a temperature of 950° C. Thus, as shown in FIG. 1D, a lower oxide film 7 having a thickness of 900 Å is formed. A nitride film 8 having a thickness of 2000 Å is formed by a CVD method over the oxide film 7.

A photoresist (not shown) is coated over the resultant structure, and an element-separation pattern is formed on the photoresist by means of photoetching. Then, as shown in FIG. 1E, the photoresist having the element-separation pattern is used as a mask, and the nitride film 8 is partially removed. Subsequently, a photoresist (not shown) is coated over the resultant structure, and a P-type inversion preventing layer pattern is formed on this photoresist by means of photoetching. With the photoresist having the P-type inversion preventing layer being used as a mask, a P-type impurity such as boron is ion-implanted under the conditions of an acceleration voltage of 50 KeV and a dose amount of $8.0\times10^{13}$ cm$^{-2}$, thereby forming a P-inversion preventing layer 9. The photoresist used for forming the P-type inversion preventing layer pattern is removed, and another photoresist is coated. Then, an N-type inversion preventing layer pattern is formed by means of photoetching on the newly formed photoresist. With the pattern used as a mask, an N-type impurity such as phosphorus is ion-implanted under the conditions of a acceleration voltage of 100 KeV and a dose amount of $5.0\times10^{12}$ cm$^{-2}$, and N-type inversion preventing layers (not shown) are formed in the individual N-type wells 4.

The device shown in FIG. 1E is subjected to a thermal oxidizing process in an atmosphere of a mixture of hydrogen and oxygen at a temperature of 1000° C., with use of a nitride film 8 having resistance to oxidation. As shown in FIG. 1F, a field oxide film 10 having a thickness of 9500 Å, which serves as an element-separation region, is formed. Subsequently, the nitride film 8 and the lower oxide film 7 are removed by a CDE method using NH$_4$F.

The resultant structure is subjected to a heat treatment in an atmosphere of oxygen and hydrochloric acid at a temperature of 950° C. Thus, a first gate oxide film 11 having a thickness of 670 Å is formed over the surface of the epitaxial layer 3.

A prescribed channel doping is carried out in the CCD formation region 200 and the formation region 300 for the N-channel type MOSFET and the P-channel type MOSFET.

In the subsequent step shown in FIG. 1H, a first polysilicon layer 12 having a thickness of 3900 Å is formed by means of a CVD method over the entire surface of the device. The first polysilicon layer 12 is rendered conductive by subjecting the same to a heat treatment in an atmosphere of an N-type impurity of POCl$_3$ at a temperature of 1000° C.

Then, a photoresist (not shown) is coated, and a gate pattern for a MOSFET using the first polysilicon layer 12, and a first gate pattern of a CCD are formed on the photoresist by means of photoetching. With the photoresist having the gate patterns being used as a mask, gates 12* of the MOSFET and first gate 12* of the CCD are formed by patterning, as shown in FIG. 1I. The photoresist having the gate patterns is removed, and another photoresist (not shown) is coated. A P-type internal base region pattern of an npn-type bipolar transistor is formed on the newly coated photoresist by means of photoetching. By using the photoresist having the P-type internal base region pattern as a mask, P-type impurity such as boron is ion-implanted under the conditions of an acceleration voltage of 40 KeV and a dose amount of $3.0\times10^{14}$ cm$^{-2}$, thereby forming a P-type internal base region 13. The resultant structure is subjected to a heat treatment in a nitrogen atmosphere at a temperature of 900° C. for 30 minutes, thus activating the ion-implanted impurity.

Subsequently, unnecessary oxide film or the like on the epitaxial layer 3 is removed by means of wet etching using NH$_4$F, and the epitaxial layer 3 is exposed, as shown in FIG. 1J.

The epitaxial layer 3 is subjected to a thermal oxidizing process in an atmosphere of a mixture of oxygen and hydrogen at a temperature of 950° C., whereby a second gate oxide film 14 having a thickness of 670 Å is formed over the entire surface of the epitaxial layer 3, as shown in FIG. 1K.

Then, as shown in FIG. 1L, a second polysilicon layer 15 having a thickness of 3900 Å is formed by means of a CVD method on the entire surface of the device. The second polysilicon layer 17 is treated and made conductive in an atmosphere of N-type impurity or POCl$_3$ at a temperature of 1000° C. A photoresist (not shown) is coated, and a second gate pattern for a second gate of a CCD, which is formed by the second polysilicon layer 12, is formed on the photoresist by means of photoetching. With the photoresist having the second gate pattern for the CCD used as a block, a second gate 15 (polysilicon) of the CCD is formed by patterning. The photoresist having the second gate pattern for the CCD is removed, and another photoresist (not shown) is coated. A high-concentration N+-type region pattern, for forming a high-concentration N+-type emitter region of an npn-type bipolar transistor, a source/drain region of an n-channel type MOSFET, and portions of a CCD in which charge is injected and accumulated, is formed by means of photoetching on the newly coated photoresist. Using the photoresist having the high-concentration N+-type region pattern as a mask, an N-type impurity such as arsenic is ion-implanted under the conditions of an acceleration voltage of 40 KeV and a dose amount of $5.0\times10^{15}$ cm$^{-2}$, thereby forming a high-concentration N+-type impurity region 16. By subjecting the resultant body to a thermal oxidizing process in an oxygen atmosphere at a temperature of 1000° C. for 20 minutes, an oxide film 17 is formed on the surface of the second gate 15 of the CCD.

Subsequently, a photoresist (not shown) is coated, and a high-concentration P+-type region pattern for forming an external base region of the NPN-type bipolar transistor and a source/drain region of the P-channel MOSFET is formed by means of photoetching on the photoresist. Using the photoresist having the high-concentration P+-type region pattern as a mask, a P-type impurity or boron is ion-implanted under the conditions of an acceleration voltage of 40 KeV and a dose amount of $2.0 \times 10^{15}$ cm$^{-2}$, thereby forming a high-concentration P$^+$-type impurity regions 18, as shown in FIG. 1M. An interlayer insulating film 19, having a triple structure consisting of a CVD oxide film with a thickness of 3000 Å, a BPSG film with a thickness of 9000 Å and a PSG film with a thickness of 2500 Å, is formed by means of a CVD method over the entire surface of the device. The device is subjected to a heat treatment in a POCl$_3$ atmosphere at a temperature of 950° C., thereby achieving phosphorus gettering. At this time, the emitter region 16 of the NPN-type bipolar transistor is diffused.

Then, a photoresist (not shown) is coated, and a predetermined contact hole pattern is formed on the photoresist by means of photoetching. Using the photoresist having the contact hole pattern as a mask, a contact hole is formed through the interlayer insulating film 19 by means of a CDE method and an RIE method, as shown in FIG. 1N. An aluminum layer 20 is formed on the entire surface of the device by means of sputtering. Subsequently, a photoresist (not shown) is coated, and a predetermined electrode pattern is formed on the photoresist by means of photoetching. Using the photoresist having the electrode pattern as a block, the aluminum layer 20 is patterned to form an aluminum electrode 20. In FIG. 1N, symbol S denotes a source of a MOSFET, D a drain thereof, E an emitter of an NPN-type bipolar transistor, B a base thereof, and C a collector thereof. In a subsequent step, a surface protection film is formed over the entire surface of the device, and predetermined wiring is formed, whereby the manufacture of a semiconductor device having the bipolar transistor region 100, CCD region 200 and MOS region 300, according to one embodiment of the invention, is finished.

Figure 2:
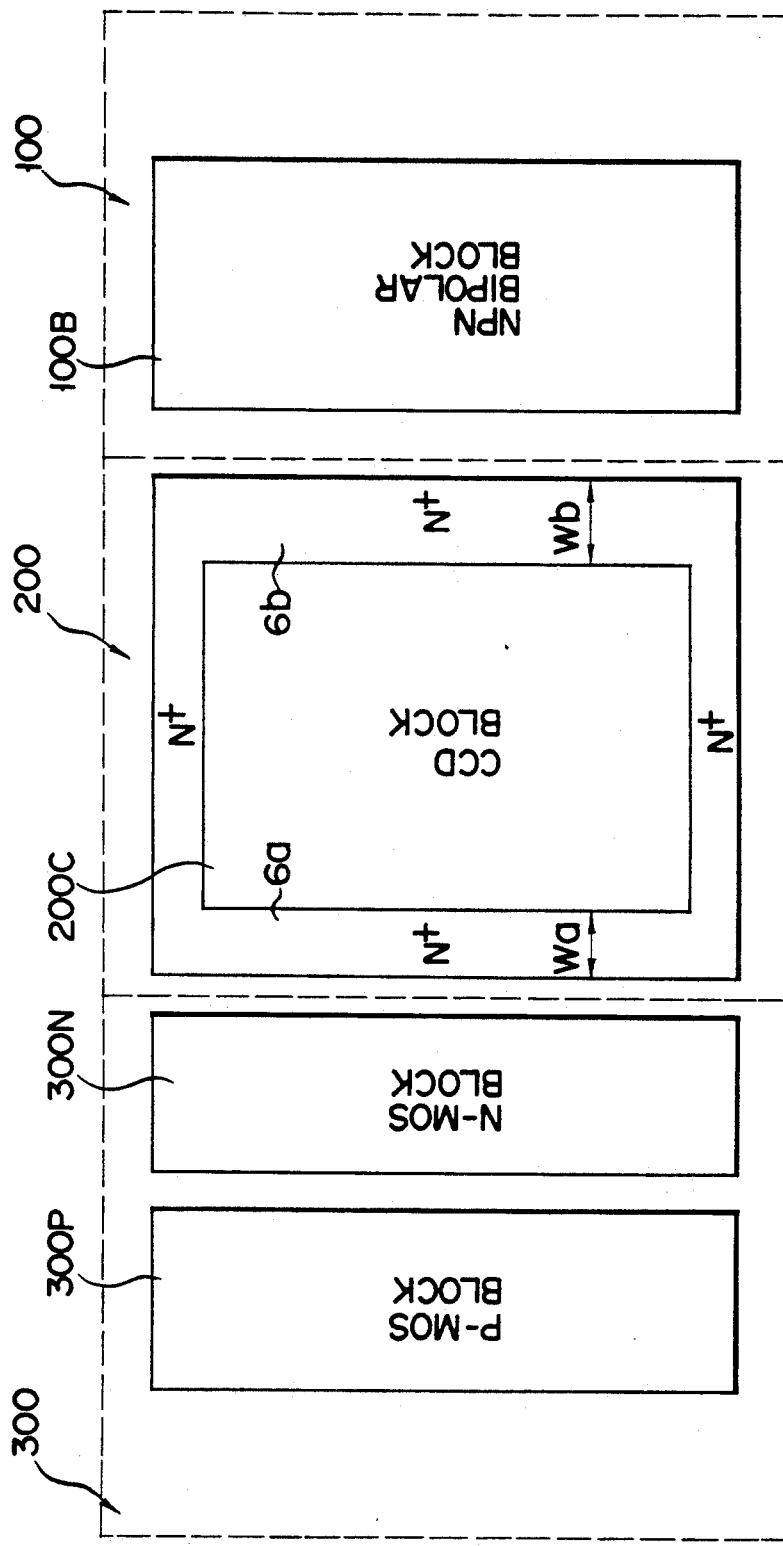
FIG. 2 is a top view of the structure shown in FIG. 1N, wherein a bipolar transistor block is arranged on the right of a CCD block surrounded by an N+-type wall.

As shown in FIG. 2, in the semiconductor device, manufactured by the above method, including the charge transfer device, the CCD (charge transfer device) block 200C is surrounded by N$^+$-type regions 6a and 6b. If the potential of the N$^+$-type regions 6a and 6b is biased to a suitable value (e.g. 0 V to 5 V), the charge of the transfer clock, leaked from the charge transfer device is absorbed into the N$^+$-type regions 6a and 6b. (When charge is leaked from the CCD block 200C to the bipolar block 100B, leaked charge is absorbed mainly to the wall of the N$^+$-type region 6b.) Thus, the charge transfer device and the bipolar transistor can be formed on a single chip, without lowering the reliability of the product. Accordingly, a sample/hold circuit and/or an operational amplifier such as an output circuit, which has conventionally been constituted by MOSFETs, can practically be constituted by bipolar transistors. Thus, the output linearity of the operational amplifier can be improved. In particular, even if a power source voltage of a bipolar operational amplifier is set to 5 V, the linearity of the bipolar operational amplifier is not degraded, and the yield at the time of a wafer test increases deterioration of linearity is very rare).

When the power source voltage is 5 V, the yield is improved as follows: in the case of a conventional sample/hold circuit or an operational amplifier such as an output circuit constituted by MOSFETs, the yield is about 70%; whereas in the case of such a circuit or amplifier constituted by bipolar transistors, the yield rises to about 90%. Furthermore, the use of the power source of 5 V realizes the reduction in consumed power, and the uniformity of power source voltage with other circuit parts. A bipolar IC for processing signals for a charge transfer device, which is conventionally formed in a separate chip, can be formed on the same single chip. A circuit board using the device of the present invention allows a decrease in space, a decrease in manufacturing cost, an increase in number of functions, and simplification of the whole system. In addition, since wiring is not required for connecting separate chips, the yield increases and accordingly the reliability also increases.

In the structure shown in FIG. 2, the influence of clock leak from the CCD block 200C is much greater in the bipolar block 100B than in the MOS block 300N. Supposing that the thicknesses of N$^+$-type walls 6a and 6b for shielding clock leak are denoted by Wa and Wb, if Wa+Wb is constant, it is desirable that Wb>Wa.

Figure 3:
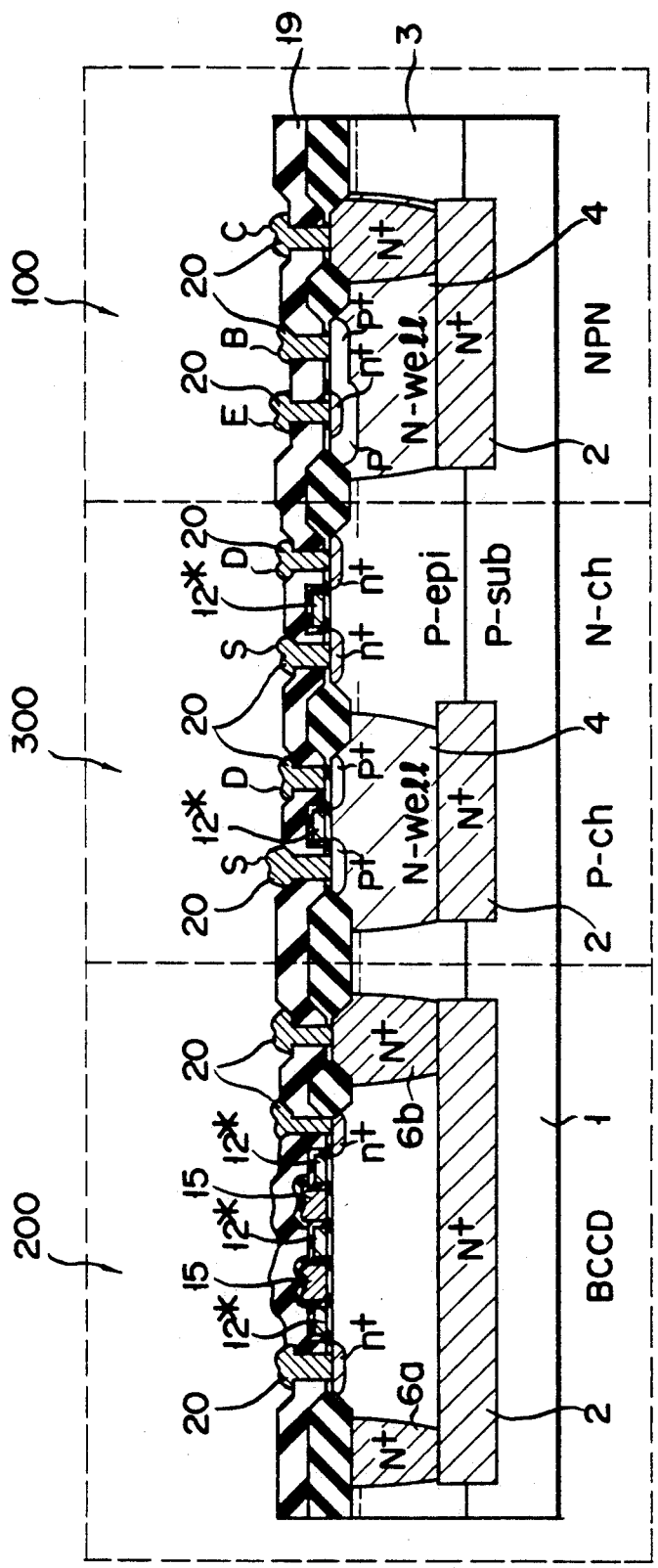
FIG. 3 shows a modification of the structure shown in FIG. 1N, wherein MOS transistor blocks are interposed between the CCD block and the bipolar transistor block.
Figure 4:
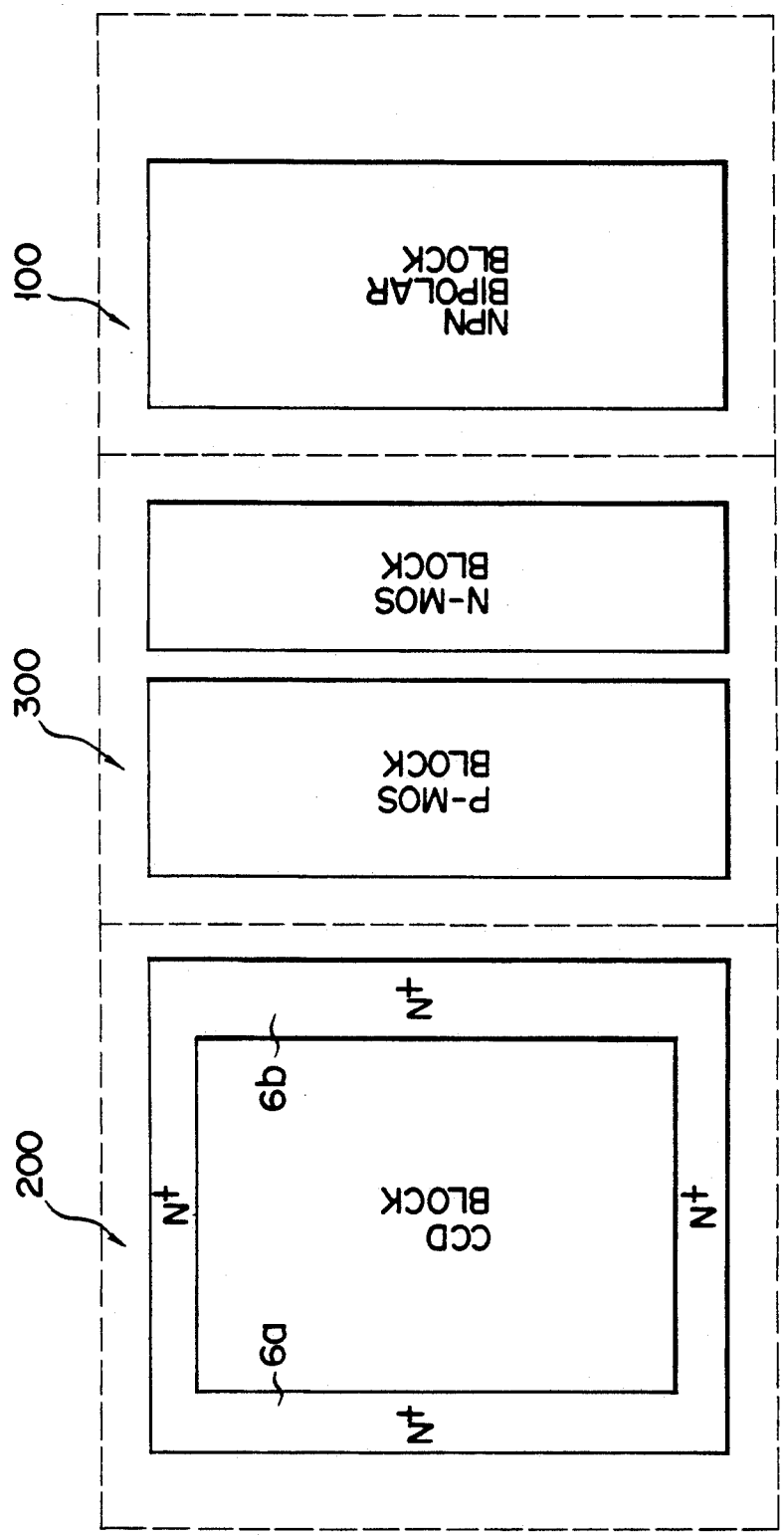
FIG. 4 is a top view of the structure shown in FIG. 3.

FIG. 3 shows a modification of the structure shown in FIG. 1N, and FIG. 4 shows a modification of the structure shown in FIG. 2. In the modifications shown in FIGS. 3 and 4, the MOS transistor block 300, which is less influenced by clock leak than the bipolar transistor block 100, is interposed between the CCD block 200 and the bipolar transistor block 100. Since a large distance can be kept between the CCD block 200 and the bipolar transistor block 100, the thickness of the N$^+$-type wall necessary for suppressing clock leak to the bipolar transistor block 100 can be smaller than in the structures shown in FIGS. 1N and 2. If the thickness of the N$^+$-type wall is reduced, the integration density of the IC can be increased.

Figure 5:
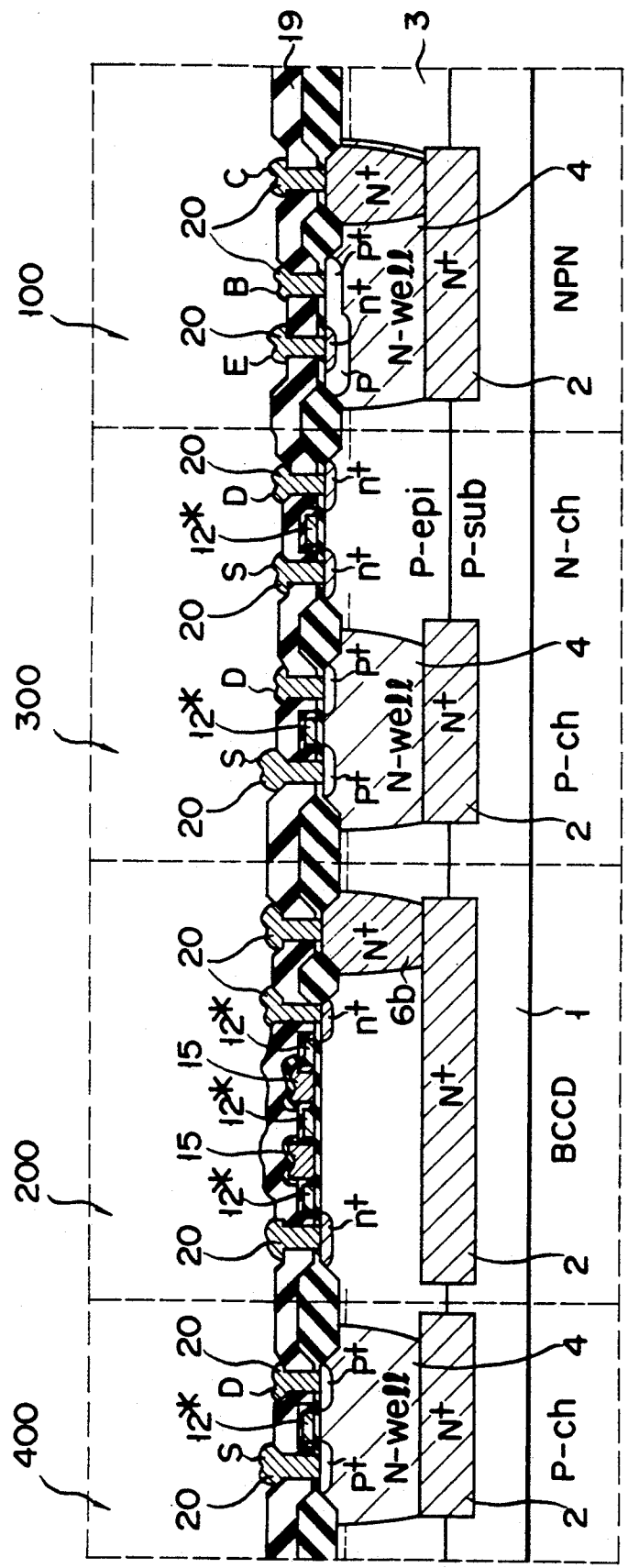
FIG. 5 shows a modification of the structure shown in FIG. 3, wherein the N+-type wall on the left of the CCD block is removed and, instead, a MOS transistor block is arranged.
Figure 6:
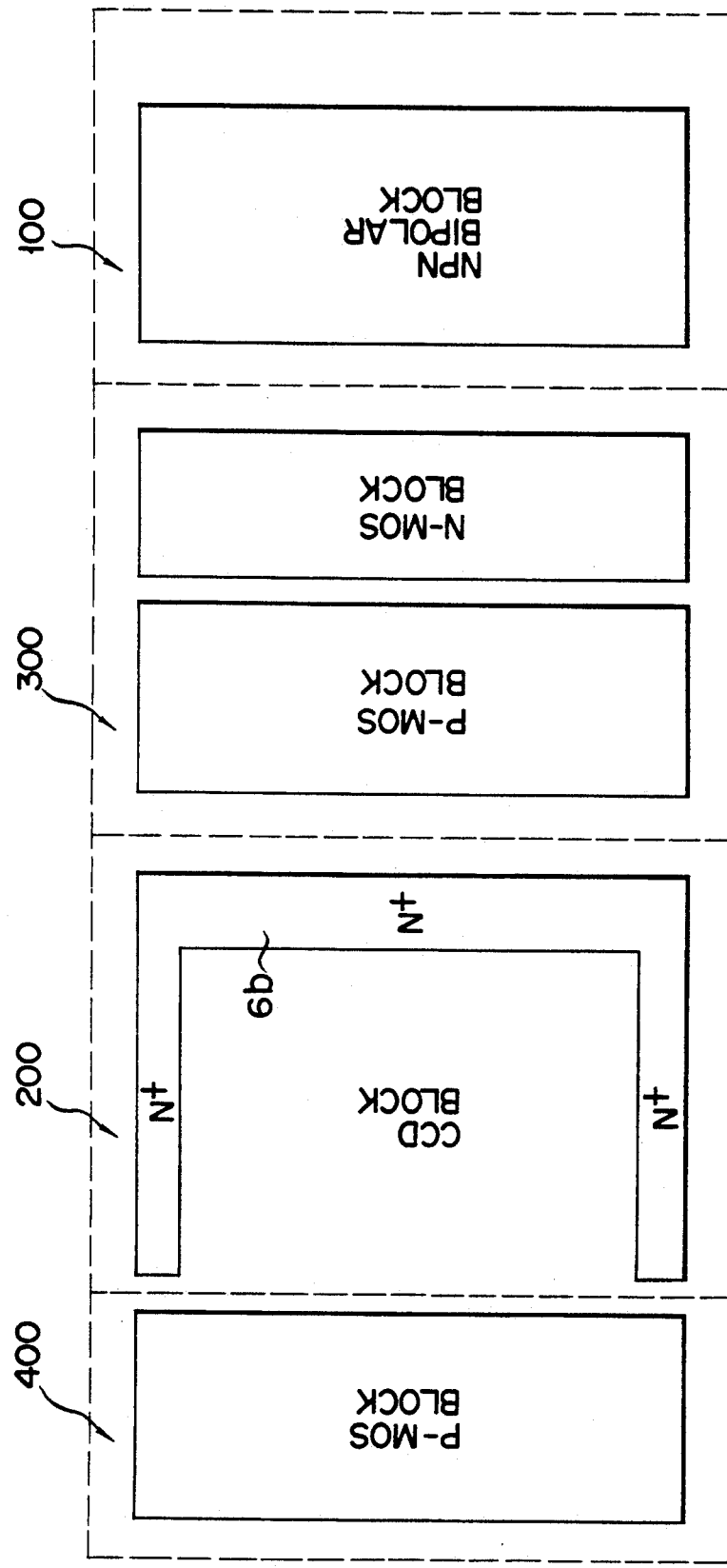
FIG. 6 is a top view of the structure shown in FIG. 5.

FIG. 5 shows a modification of the structure shown in FIG. 3, and FIG. 6 shows a modification of the structure shown in FIG. 4. In the modifications shown in FIGS. 5 and 6, the P-MOS transistor block 300 is arranged to face the bipolar transistor block 100. Since the P-MOS transistor block is not easily influenced by the clock leak from the CCD block 200, the N$^+$-type wall provided between the P-MOS transistor block 300 and the CCD block 200 is removed to increase the IC integration density.

In the above embodiments, the present invention can be put into practice, even if the semiconductor conductivity types N and P are interchanged.

As has been described above, according to the present invention, a charge transfer device and a bipolar transistor can be formed on a single chip, without lowering the reliability of the finished device. Thus, if a linear amplifier in a semiconductor device including a charge transfer device is constituted by bipolar transistors, the linearity of the linear amplifier is improved, the yield of products is enhanced, and the high-performance of the device is attained.

Furthermore, in the semiconductor device including the charge transfer device and the method of manufacturing the same, according to the present invention, if a bipolar IC for processing signals for the charge transfer device is formed on the same chip, the number of functions of the semiconductor device including the charge transfer device is increased, and the whole system is simplified.

Therefore, the semiconductor device and the manufacturing method thereof, according to the invention, are suitable for apparatuses using CCDs, such as a signal processing system in a VTR, a TV system, a movie camera, etc.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor chip;
   a bipolar transistor formed in said semiconductor chip and including emitter, base, and collector regions;
   a charge transfer device formed in said semiconductor chip;
   a MOS device comprising at least one MOS transistor formed in said semiconductor chip, said charge transfer device arranged between said bipolar transistor and said MOS device;
   a charge absorbing region of a first conductivity type spaced from said emitter, base, and collector regions of said bipolar transistor and surrounding said charge transfer device for preventing leakage of charge from said charge transfer device to said bipolar transistor, wherein a portion of said charge absorbing region separating said charge transfer device from said bipolar transistor has a first thickness and a portion of said charge absorbing region separating said charge transfer device from said MOS device has a second thickness less than the first thickness.

2. The device according to claim 1 wherein said charge transfer device comprises a charge coupled device.

3. The device according to claim 1, wherein said charge absorbing region comprises a diffusion region.

4. The device according to claim 1 wherein said collector region of said bipolar transistor comprises a collector region of the first conductivity type and surrounds said emitter and base regions of said bipolar transistor.

5. A semiconductor device comprising:
   a semiconductor chip including a semiconductor substrate of a first conductivity type and an epitaxial layer of the first conductivity type on said substrate;
   a field insulating film on said epitaxial layer defining a bipolar element region and a charge transfer device region;
   a first region of a second conductivity type in said charge transfer device region and adjacent an interface of said substrate and said epitaxial layer;
   a bipolar transistor in said bipolar transistor region including an emitter, a base, and a collector of the second conductivity type surrounding said base and emitter regions;
   a charge transfer device in said charge transfer device region driven by clock signals; and
   a second region of the second conductivity type in said charge transfer region and contacting said first region to surround said charge transfer device region and absorb charge generated in said charge transfer device when clock signals are applied thereto, wherein said second region includes a first portion adjacent to the collector of said bipolar transistor and having a thickness Wb and a second portion further from the collector of said bipolar transistor than said first portion and having a thickness Wa which is less than the width Wb.

* * * * *